US007421258B2

(12) United States Patent
Bauschke et al.

(10) Patent No.: US 7,421,258 B2
(45) Date of Patent: Sep. 2, 2008

(54) COMPACT TEMPERATURE TRANSMITTER WITH IMPROVED LEAD CONNECTIONS

(75) Inventors: Dirk W. Bauschke, Shakopee, MN (US); Hiep Huu Nguyen, Brooklyn Park, MN (US)

(73) Assignee: Rosemount Inc., Eden Prairie, MN (US)

( * ) Notice: Subject to any disclaimer, the term of this patent is extended or adjusted under 35 U.S.C. 154(b) by 637 days.

(21) Appl. No.: 10/683,303

(22) Filed: Oct. 10, 2003

(65) Prior Publication Data

US 2005/0079833 A1    Apr. 14, 2005

(51) Int. Cl.
*H04B 1/034*    (2006.01)
(52) U.S. Cl. .................. 455/128; 455/97; 455/117; 248/50; 248/51; 248/67.5; 361/117; 361/56; 340/870.17
(58) Field of Classification Search .............. 455/95, 455/100, 128, 134, 129, 238; 248/50, 51, 248/67.5; 340/870.17
See application file for complete search history.

(56) References Cited

U.S. PATENT DOCUMENTS

| 2,288,082 | A | * | 6/1942 | Gailmard et al. | 369/27.01 |
| 3,138,776 | A | * | 6/1964 | Jones, Jr. | 338/28 |
| 4,021,094 | A | | 5/1977 | Hild et al. | 339/246 |
| 4,728,295 | A | * | 3/1988 | Henrici et al. | 439/84 |
| 4,913,666 | A | | 4/1990 | Murphy | 439/709 |
| 5,403,996 | A | * | 4/1995 | Mattis et al. | 219/265 |
| 5,987,335 | A | * | 11/1999 | Knoedl et al. | 455/561 |
| 5,999,393 | A | * | 12/1999 | Brower | 361/117 |

FOREIGN PATENT DOCUMENTS

| CN | 2212775 Y | 11/1995 |
| DE | 40 11 557 A1 | 10/1990 |
| DE | 195 08 606 A1 | 9/1995 |
| GB | 2288082 A * | 9/1995 |

OTHER PUBLICATIONS

Anonymous, "Rosemount 248 Temperature Monitoring Assembly," Rosemount 248 Product Data Sheet, pp. 1-18, Jul. 2003.
Chinese Office Action from foreign application No. 200410084908.1 filed Oct. 11, 2004.

* cited by examiner

*Primary Examiner*—Nay Maung
*Assistant Examiner*—Richard Chan
(74) *Attorney, Agent, or Firm*—Christopher R. Christenson; Westman, Champlin & Kelly, P.A.

(57) ABSTRACT

A compact industrial process transmitter is provided having an electronics module that includes a top surface with a plurality of lead attachment points thereon. At least one of the lead attachment points disposed on the top surface of the compact temperature transmitter electronics module includes a upwardly extending external lead attachment clip. In some aspects, a plurality of upwardly extending lead attachment clips as well as lead attachment points that have a lead wire engaging surface that is substantially flush with or raised above the top surface of the compact temperature transmitter electronics module.

9 Claims, 7 Drawing Sheets

COMPACT TEMPERATURE TRANSMITTER WITH IMPROVED LEAD CONNECTIONS

FIELD OF THE INVENTION

The present invention relates to process transmitters. More specifically, the present invention relates to compact process transmitters.

BACKGROUND OF THE INVENTION

The process industry employs process variable transmitters to monitor process variables associated with substances such as solids, slurries, liquids, vapors, and gasses in chemical, pulp, petroleum, pharmaceutical, food and other processing plants. Process variables include pressure, temperature, flow, level, turbidity, density, concentration, chemical composition and other properties. A process fluid temperature transmitter provides an output related to a sensed process fluid temperature. The temperature transmitter output can be communicated over a process communication loop to a control room, or the output can be communicated to another process device such that the process can be monitored and controlled. In order to monitor a process fluid temperature, the transmitter includes a sensor, such as a resistance temperature device (RTD) or thermocouple.

One specific type of temperature transmitter is known as a head-mount temperature transmitter. Such a transmitter generally includes a connection head or junction box that is ruggedized for exposure to harsh environments. The connection head can be designed in accordance with the criteria of current DIN standard 43 729 Form B. Such design is relatively smaller than other process variable transmitter enclosures. The smaller design facilitates transmitter mounting in crowded installation environments. Further, the smaller design also provides a smaller mass coupled to the sensor probe. Such mass reduction reduces the possibility of vibration damage occurring in the transmitter.

The connection head, or junction box can be explosion-proof in conformance with NEC Sections 500-503, dated 1996. Typically, an electronics module is placed within the connection head and mounted with fasteners to provide a transmitter that is highly modular. Such modularity facilitates transmitter configuration changes as well as maintenance. An example of such a head-mount temperature transmitter is the Model 248 Temperature Transmitter available from Rosemount, Inc. of Eden Prairie, Minn.

This connection head size limitation puts severe constraints on the types of lead connections that are available within the transmitter. Traditionally, terminal blocks have been used for connecting sensor, communication, and/or power leads to the transmitter electronics itself. Additionally, some known compact temperature transmitters also provide external lead attachment clips to facilitate the attachment of external leads by a technician to the electronics module for maintenance and/or diagnostics. These known attachments have suffered from certain drawbacks.

Known external lead attachment clips have generally undesirably expanded the physical envelope of the electronics package. This is because such clips generally provided additional metallic loops which extend beyond the diameter of the electronics package. In industrial processing control environments employing compact transmitters such as those which comply with DIN standard 43 729 Form B, such expansion of the physical envelope is highly undesirable.

The provision of a compact process transmitter that is able to comply with the stringent space constraints of DIN standard 43 729 Form A or Form B while facilitating lead attachments and while providing external lead attachment clips that do not undesirably expand the physical envelope of the electronics module would be desirable to the art.

SUMMARY OF THE INVENTION

A compact industrial process transmitter is provided having an electronics module that includes a top surface with a plurality of lead attachment points thereon. At least one of the lead attachment points disposed on the top surface of the compact temperature transmitter electronics module includes an upwardly extending external lead attachment clip. In some aspects, a plurality of upwardly extending lead attachment clips are provided. Additionally, some lead attachment points can have a lead wire engaging surface that is substantially flush with or raised above the top surface of the compact transmitter electronics module.

DETAILED DESCRIPTION OF THE PREFERRED EMBODIMENTS

Although the present invention will be described with reference to embodiments of a specific compact temperature transmitter, workers skilled in the art will recognize that embodiments of the present invention may be practiced with any compact industrial process measurement and/or control transmitters without departing from the spirit and scope of the invention.

As used herein a "compact" transmitter is intended to mean any industrial control and/or measurement transmitter employing a transmitter electronics module that is substantially circular in shape having a diameter of approximately 1.7 inches (45 millimeters) or smaller and a height of 0.97 inches (24.5 millimeters) or less. This physical envelope will ensure that the module will fit within a transmitter head specified in DIN Standard 43 729 (1978).

Figure 1:
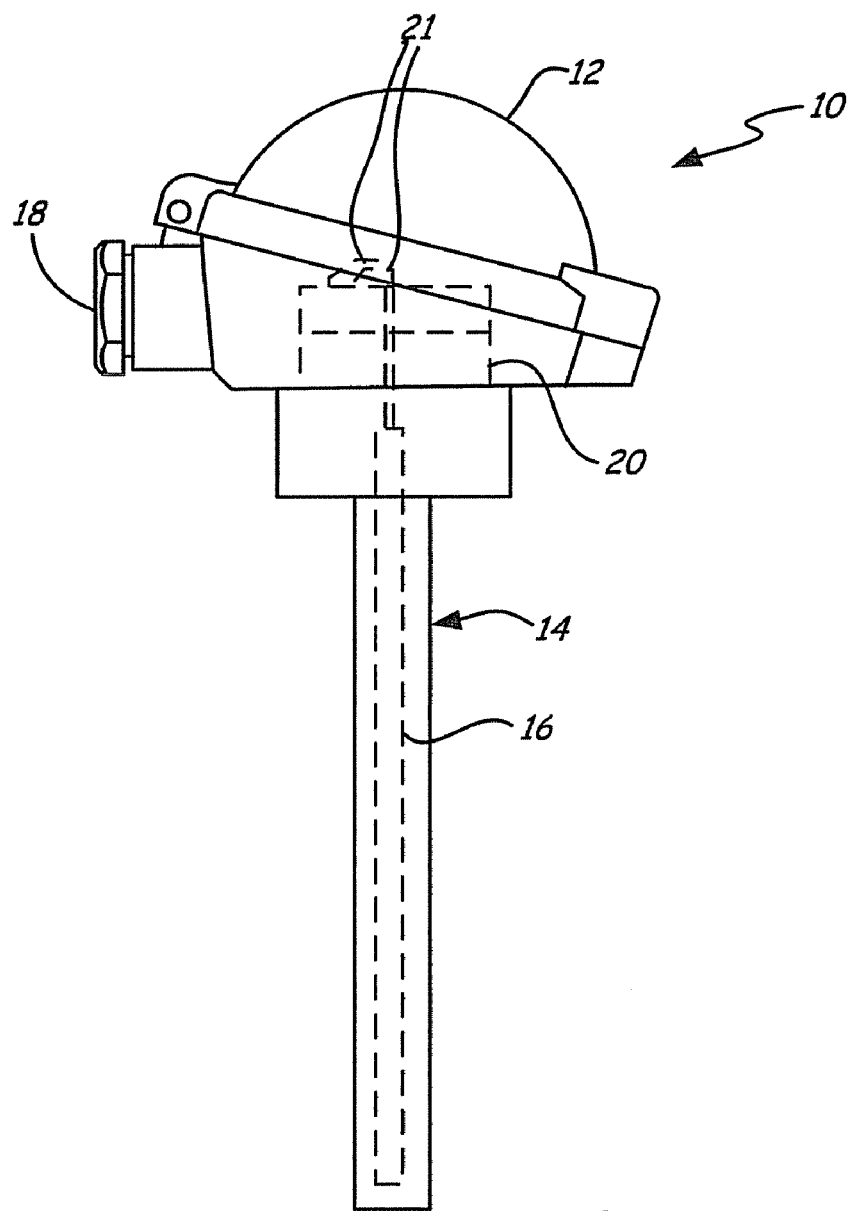
FIG. 1 is a diagrammatic view of a compact temperature transmitter in which embodiments of the present invention are particularly useful.

FIG. 1 is a diagrammatic view of compact industrial measurement and control transmitter 10 in accordance with embodiments with the present invention. Transmitter 10 usually includes a field hardened enclosure, sometimes referred to as a connection head 12, probe portion 14 containing therein a suitable industrial sensor, such as a temperature sensor 16, and wiring access port 18. Transmitter 10 also includes, disposed within connection head 12, compact transmitter electronics module 20 electrically coupled to sensor 16 via wires 21. In operation, transmitter 10 is generally mounted within an industrial process control and measurement installation and coupled to a process control and measurement loop through access port 18.

Figure 2A:
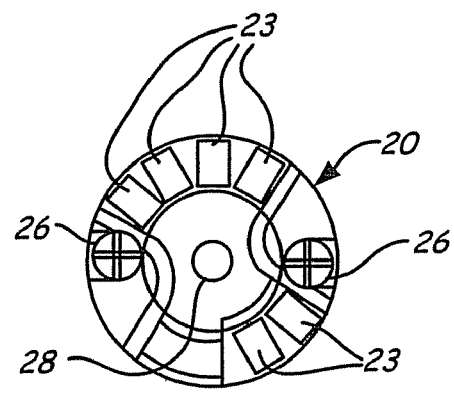
FIGS. 2A and 2B are top plan and front elevation views of a compact temperature transmitter electronics module in accordance with embodiments of the present invention.
Figure 2B:
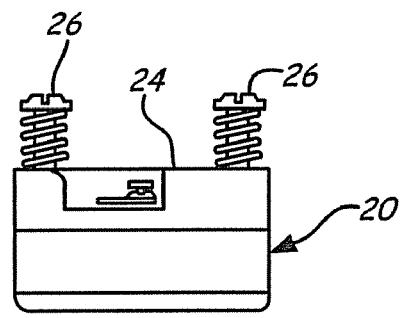

FIGS. 2A and 2B are top plan and front elevation views, respectfully, of compact transmitter electronics module 20 in accordance with embodiments of the present invention. As illustrated in FIG. 2A, module 20 is preferably circular in shape and has an outer diameter that is approximately 44 millimeters or less. Additionally, compact transmitter electronic module 20 includes a number of lead attachment points 23 disposed on, or near top surface 24 of module 20. Lead attachment points 23 as used herein are physical locations on the electronics module that couple to leadwires. Module 20 is also adapted to receive a pair of spring loaded mounting screws 26 that are used to mount module 20 within connection head 12 (shown in FIG. 1). Finally, compact transmitter electronic module 20 also includes through-hole 28 which is provided to facilitate connection to sensor wiring, which sensor(s) are generally disposed below module 20, as illustrated in FIG. 1.

Figure 3:
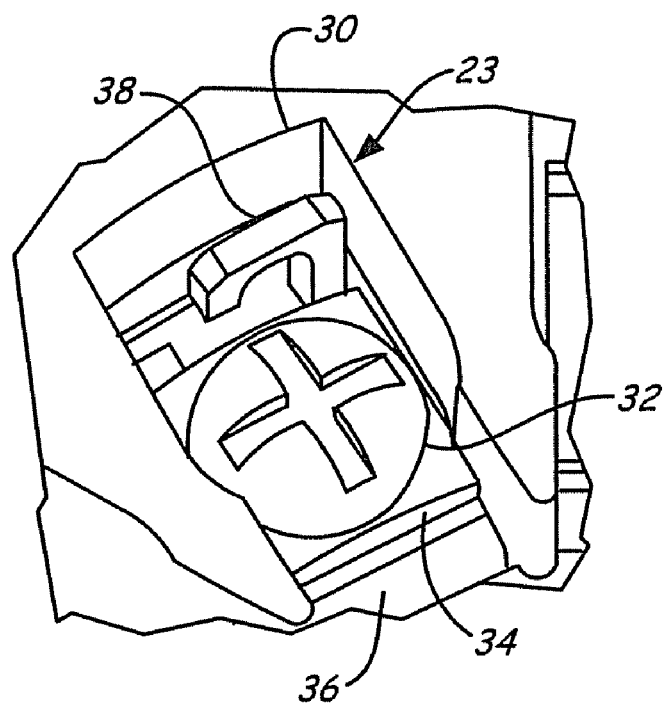
FIG. 3 is a perspective view of a single lead attachment point and upwardly extending external lead attachment clip in accordance with embodiments of the present invention.

FIG. 3 is a perspective view of a lead attachment point 23 in accordance with embodiments of the present invention. Lead attachment point 23 generally includes a molded cavity 30 that is molded into or disposed upon the top surface 24 of compact transmitter electronics module 20. Screw 32, upper washer 34, and anchor 36 are positioned within molded cavity 30. Also illustrated in FIG. 3 is upwardly extending external lead attachment clip 38. In order to couple a lead wire to lead attachment point 23, screw 32 is withdrawn to such an extent that a gap will form between upper plate 34 and anchor 36 that is large enough to accommodate the lead. The lead is than inserted between upper plate 34 and anchor 36 and screw 32 is rotated to bear against upper plate 34 thereby compressing and retaining the lead within and between upper plate 34 and anchor 36. External lead attachment clip 38 can be provided on one or all of lead attachment points 23. Moreover, as will be described in further detail later in the specification, external lead attachment clip 38 can be constructed as a part of anchor 36, plate 34 or screw 32.

Figure 4A:
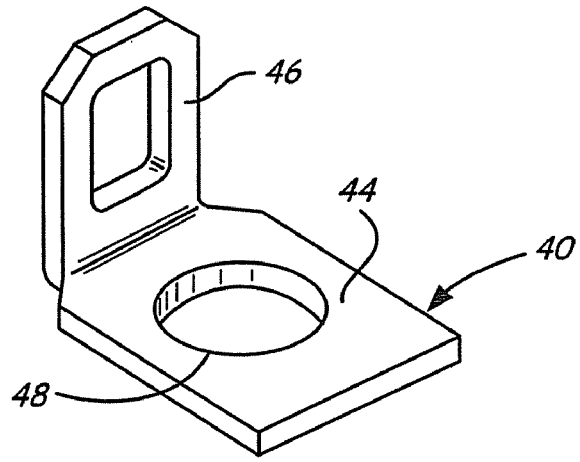
FIGS. 4A and 4B are perspective views of an upper lead engagement plate and lower lead anchor with in accordance with embodiments of the present invention.
Figure 4B:
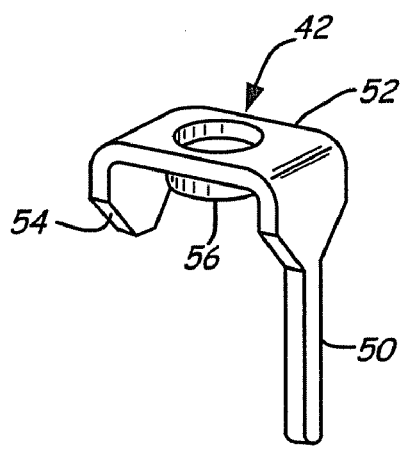

FIGS. 4A and 4B illustrate upper plate 40 and anchor 42 that can cooperate in accordance with embodiment of the present invention. Upper plate 40 generally includes a screw engaging surface 44 and upwardly extending external lead attachment clip 46 disposed on one side of plate 40. As illustrated in FIG. 4A the upwardly extending external lead attachment clip 46 may be in the form of an upwardly extending loop (46 as illustrated in FIG. 4A) or an upwardly extending hook (38 illustrated in FIG. 3). Hooks and loops allow module 20 to be easily coupled to an external handheld field communications/diagnostic device. Moreover, hooks and clip allow the connection to be made in such a manner that the leads will not fall off, thus allowing the technician to perform other tasks without having to hold the leads in place. Plate 40 also includes through-hole 48 that is sized to pass a standard attachment screw such as screw 32 illustrated in FIG. 3.

FIG. 4B is a perspective view of anchor 42 with which mounting plate 40 can be used to practice an embodiment of the present invention. Anchor 42 includes electrical attachment tang 50 coupled to bottom plate region 52 which is in turn coupled to anchor tab 54. Bottom plate region 52 also preferably includes an integral threaded sleeve 56 that is adapted to threadably receive a standard attachment screw, such as screw 32. In operation, anchor 42 is disposed firmly within a junction block and upper plate 40 sits atop anchor 42. A lead wire is passed between upper plate 40 and anchor 42 and is urged against anchor 42 by virtue of the lead attachment screw passing freely through clearance hole 48 and threadably securing within sleeve 56.

Figure 5A:
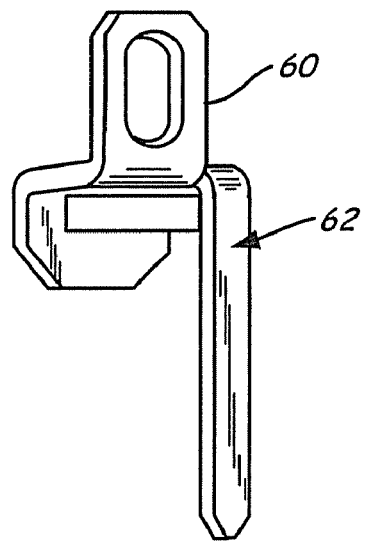
FIGS. 5A and 5B are perspective and front elevation views of a lower lead anchor having an upwardly extending lead attachment clip in accordance with embodiments of the present invention.
Figure 5B:
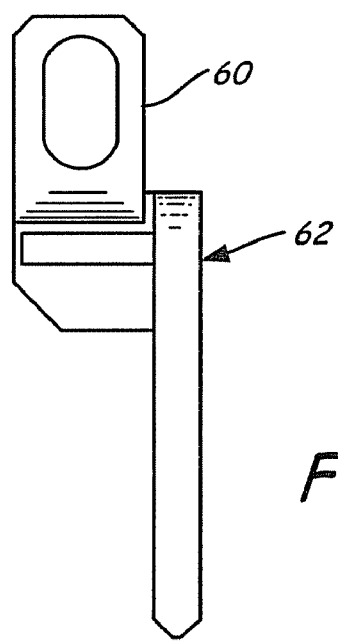

FIGS. 5A and 5B are perspective and front elevation views of an alternate lead attachment anchor in accordance with an alternate embodiment of the present invention. As illustrated in FIG. 5A an upwardly extending external lead attachment clip 60 is coupled directly to anchor 62 which otherwise substantially resembles anchor 42 illustrated and described with respect to FIG. 4B. The provision of clip 60 in anchor 62 allows standard upper mounting plates or even round washers to be used to connect lead wires.

Figure 6:
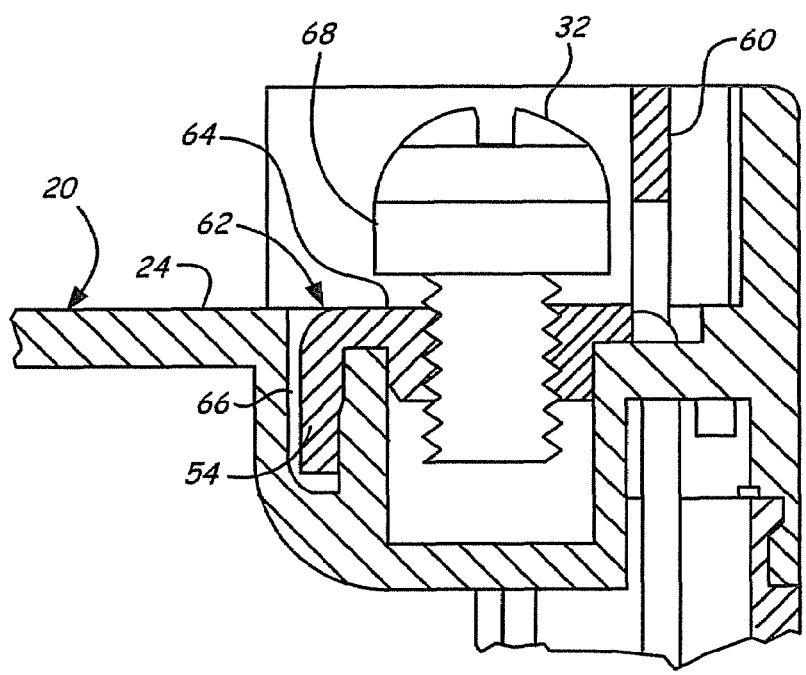
FIG. 6 is a side elevation cross section view of the lead attachment anchor illustrated in FIGS. 5A and 5B deployed on a compact temperature transmitter electronics module.

FIG. 6 is a cross sectional side elevation view of anchor 62 deployed within compact transmitter electronics module 20 in accordance with embodiment of the present invention. Transmitter module 20 includes upper transmitter surface 24 which is preferably, as illustrated in FIG. 6, substantially coplanar with upper lead engaging surface 64 of anchor 62. Anchor 62 also includes anchor tab 54 which is cooperatively disposed within slot 66 in transmitter module 20 such that anchor 62 does not rotate when screw 32 is rotated. Beneath the head of screw 32 is a flat washer 68 that is used to bear against a lead wire (not shown) to electrically connect and physically couple the lead wire to the transmitter. Preferably, an upwardly extending external lead attachment clip 60 is included to facilitate coupling the lead to external maintenance and/or diagnostics devices. Such devices are very useful for configuring field devices; troubleshooting problems with field devices or performing any other type of maintenance as may me be appropriate.

Figure 7:
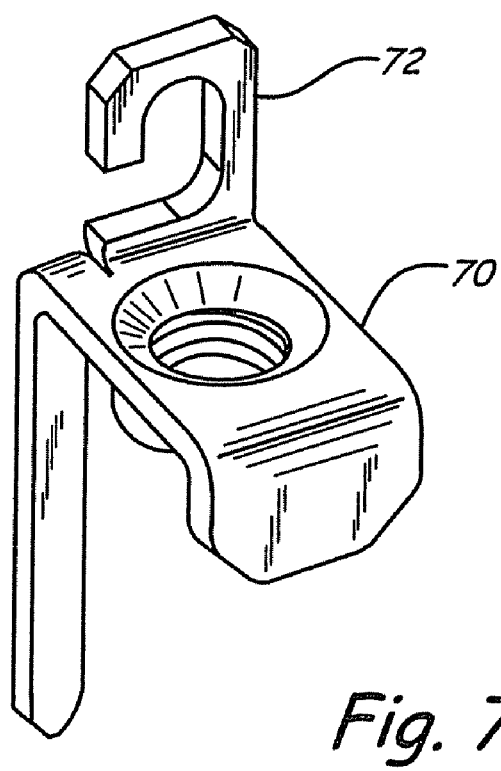
FIG. 7 is a perspective view of a lower lead attachment anchor in accordance with an embodiment of the present invention.

FIG. 7 is a diagrammatic view of lead anchor 70 in accordance with an alternate embodiment of the present invention. Lead anchor 70 is substantially identical to lead anchor 62 illustrated and described with respect to FIGS. 5A and 5B except that lead anchor 70 includes a external lead attachment clip 72 that is in the form of a hook.

Although the present invention has been described with reference to specific embodiments of a head-mount type process temperature transmitters, workers skilled in the art will recognize that changes may be made in form and detail without departing from the spirit and scope of the invention. While embodiments of the present invention have generally provided an external lead attachment clip connected to and integral with either a mounting plate or an anchor of a lead junction block connection, it is expressly contemplated that embodiments of the present invention can be practiced using a sufficiently adapted lead attachment screw and standard mounting plates and anchors. Specifically, a screw having a screw head that has an upwardly extending lead attachment clip region would provide benefits of the present invention as long as the screw is still adapted to receive sufficient torque such that it could be tightened by an appropriate tool.

What is claimed is:
1. A compact process transmitter comprising:
   a compact transmitter electronics module disposed within an enclosure and having a plurality of lead attachment points on a top surface thereof;
   wherein at least one lead attachment point includes a mounting plate, an anchor and a lead attachment screw passing through the mounting plate and being threadably received within the anchor;

wherein at least one of the lead attachment points includes an upwardly extending external lead attachment clip that is coupled to the mounting plate; and wherein the external lead attachment clip comprises at least one of a hook or a loop.

2. The transmitter of claim 1, wherein at least a plurality of the lead attachment points include an upwardly extending external lead attachment clip.

3. The transmitter of claim 1, wherein the anchor has a top surface that is substantially coplanar with the top surface of the compact transmitter electronics module.

4. The transmitter of claim 1, wherein the upwardly extending external lead attachment clip includes a loop.

5. The transmitter of claim 1, wherein the external lead attachment clip includes a hook.

6. The transmitter of claim 1, wherein the compact transmitter electronics module is a compact temperature transmitter electronics module.

7. A compact process transmitter comprising:

a compact transmitter electronics module disposed within an enclosure and having a plurality of lead attachment points on a top surface thereof;

wherein at least one lead attachment point includes a mounting plate, an anchor and a lead attachment screw passing through the mounting plate and being threadably received within the anchor;

wherein at least one of the lead attachment points includes an upwardly extending external lead attachment clip that is coupled to the anchor; and wherein the external lead attachment clip comprises at least one of a hook or a loop.

8. The transmitter of claim 7, wherein the upwardly extending external lead attachment clip includes a loop portion.

9. The transmitter of claim 7, wherein the upwardly extending external lead attachment clip includes a hook.

* * * * *

UNITED STATES PATENT AND TRADEMARK OFFICE
CERTIFICATE OF CORRECTION

PATENT NO.         : 7,421,258 B2                                        Page 1 of 1
APPLICATION NO.    : 10/683303
DATED              : September 2, 2008
INVENTOR(S)        : Bauschke et al.

It is certified that error appears in the above-identified patent and that said Letters Patent is hereby corrected as shown below:

Title Page under (56) References Cited, please add --Copy of rejection in Chinese Application No. 200410084908.1--

Signed and Sealed this

Eighth Day of September, 2009

David J. Kappos
*Director of the United States Patent and Trademark Office*